(12) United States Patent
Gregg et al.

(10) Patent No.: US 8,374,815 B2
(45) Date of Patent: Feb. 12, 2013

(54) SELF-CALIBRATING TEST SYSTEM

(75) Inventors: Justin Gregg, San Francisco, CA (US); Tomoki Takeya, Santa Clara, CA (US); Adil Syed, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 266 days.

(21) Appl. No.: 12/769,602

(22) Filed: Apr. 28, 2010

(65) Prior Publication Data

US 2011/0270561 A1 Nov. 3, 2011

(51) Int. Cl.
*G01D 18/00* (2006.01)
*G06F 11/30* (2006.01)

(52) U.S. Cl. ........... 702/85; 702/182; 702/183; 702/184

(58) Field of Classification Search ........ 702/85, 702/108–122, 179–189
See application file for complete search history.

(56) References Cited

U.S. PATENT DOCUMENTS

| | | | |
|---|---|---|---|
| 4,637,020 A | 1/1987 | Schinabeck | |
| 6,643,597 B1 | 11/2003 | Dunsmore | |
| 6,947,709 B2 | 9/2005 | Kaindl | |
| 7,113,883 B1 | 9/2006 | House et al. | |
| 7,184,913 B2 * | 2/2007 | Asano | 702/108 |
| 7,203,616 B2 | 4/2007 | Mok | |
| 7,437,262 B2 | 10/2008 | Boose et al. | |
| 2006/0155410 A1* | 7/2006 | Yamartino | 700/108 |
| 2009/0298440 A1 | 12/2009 | Takeya et al. | |
| 2011/0006794 A1 | 1/2011 | Sellathamby et al. | |

* cited by examiner

*Primary Examiner* — Phuong Huynh
(74) *Attorney, Agent, or Firm* — Treyz Law Group; G. Victor Treyz; Jason Tsai

(57) ABSTRACT

A test system may include multiple test stations. Electronic devices may be tested using the test system. Each test station may include a test unit such as a radio-frequency tester that can make wireless and wired radio-frequency signal measurements on devices under test. The test stations may be configured to perform pass-fail testing on devices under test during manufacturing. One or more selected devices under test that have passed the pass-fail tests may be retested using the test stations. Multiple tests may be performed at a given test station using the same selected device under test. Gathered test data may be analyzed to determine whether the test stations have sufficient accuracy and precision or need to be recalibrated or taken offline.

19 Claims, 8 Drawing Sheets

| TEST NO. | DUT SER. NO. | STATION NO. | TX POW | |
|---|---|---|---|---|
| 1 | 111 | A1 | 23.4 | $\mu S_{A1}=23.3$, R=.2 |
| 2 | 111 | A1 | 23.2 | |
| 3 | 111 | A2 | 23.0 | $\mu S_{A2}=22.8$, R=.4 |
| 4 | 111 | A2 | 22.6 | |
| 5 | 112 | A3 | 24.2 | $\mu S_{A3}=24.6$, R=.9 |
| 6 | 112 | A3 | 25.0 | |
| 7 | 112 | A4 | 24.3 | R=N/A |

FIG. 4

SELF-CALIBRATING TEST SYSTEM

BACKGROUND

This relates generally to testing equipment used in manufacturing electronic devices, and more particularly, to self-calibrating test systems used during device manufacturing.

Electronic devices such as cellular telephones include numerous electronic and mechanical components. Tests are performed during manufacturing to ensure that devices are operating satisfactorily before they are shipped and sold to end users. For example, pass-fail tests are often performed in which a device is tested to determine whether it is operating within specified limits. This type of test may be performed on the wireless circuitry in a device. If a device is not operating properly, the device can be reworked or discarded.

Test equipment such as radio-frequency (RF) test stations can become unreliable if not periodically calibrated.

Each test station typically includes a radio-frequency test unit that generates and receives radio-frequency signals from a device under test (DUT). A test host that is coupled to the test unit is used in controlling operation of the test station. A radio-frequency test chamber may be included in the test station. During tests, a device under test may be mounted on a fixture in the test chamber. A cable may be used to couple the test unit to an antenna in the test chamber. This allows the test station to be used in performing over-the-air (wireless) tests. The test unit may also be connected to a DUT using a cable and the fixture in the test chamber.

One way to calibrate an RF test station involves measuring test station performance using equipment such as a vector network analyzer or power meter. With this type of arrangement, a technician must typically remove all test cables and other components that are located between the test unit and the DUT. The technician must then measure the RF performance of these components using the vector network analyzer or power meter. The measurements may be used to determine how much loss (RF attenuation) is being produced by the cables and other components. The loss measurement may be used to calibrate the test station.

Another way to calibrate an RF test station involves use of a reference DUT. The reference DUT can be calibrated to known standards. Once calibrated, the reference DUT may be used to calibrate an RF test station by comparing measurements made using the reference DUT and the test station to expected values. Both wired and wireless path loss measurements may be made using a reference DUT.

Calibration operations can also be made by placing a reference antenna in a test chamber and by feeding the reference antenna with a signal from a signal generator.

Calibration techniques such as these tend to be manpower intensive. For example, it may take a technician a significant amount of time to calibrate a single station. To perform routine calibration operations in a large factory, numerous technicians must be available. The possibility of human error is also a factor when using these calibration techniques. Cabling must be detached and reattached, leading to the potential for poor cable attachment and random measurement errors. In schemes that rely on reference DUTs, there is a possibility that the reference DUTs will become damaged or lost. The process of producing and distributing reference DUTs may also be burdensome, particularly in an organization with geographically dispersed manufacturing facilities. Schemes that use reference antennas may be sensitive to antenna placement due to the near-field nature of this type of calibration measurement.

These techniques also suffer from the lack of a single absolute external reference for all of the test stations. Satisfactory calibration of a large number of test stations may therefore involve the use of numerous vector network analyzers, reference DUTs, or reference antennas. Large amounts of calibration equipment can be expensive to maintain and can be prone to loss and damage.

It would therefore be desirable to be able to provide improved ways in which to calibrate test equipment such as radio-frequency test equipment used during manufacturing of electronic devices.

SUMMARY

A test system may be used to test electronic devices during manufacturing. The test system may include multiple test stations each of which includes a radio-frequency tester coupled to a test host. A network may be used to interconnect the test stations to computing equipment that is used to implement a database system.

During manufacturing, electronic devices may be tested using the test system to determine whether they exhibit satisfactory radio-frequency efficiencies and to determine whether other suitable performance criteria have been satisfied. The test stations may be configured to perform pass-fail testing on devices under test. If a device under test fails testing, the device under test may be reworked or discarded. If the device under test passes testing, the device under test may be sold and shipped to a party such as a retail or wholesale customer.

One or more selected devices under test that have passed the pass-fail tests may be used as temporary reference-type devices. Following use of these devices under test to determine whether or not the test stations need to be recalibrated or otherwise serviced, the devices under test may be sold or shipped to a retail or wholesale customer as with other production devices under test.

When making test measurements with the selected devices under test, multiple tests may be performed at a given test station using the same selected device under test. Gathered test data may be analyzed to determine whether the test stations have sufficient accuracy and precision or need to be recalibrated or taken offline.

Further features of the invention, its nature and various advantages will be more apparent from the accompanying drawings and the following detailed description of the preferred embodiments.

BRIEF DESCRIPTION OF THE DRAWINGS

FIG. 4 is a table of illustrative test station measurements that may be made to determine whether to calibrate test stations in a test system in accordance with an embodiment of the present invention.

DETAILED DESCRIPTION

Electronic devices can be tested during manufacturing. For example, wireless electronic devices can be tested to determine whether they are sending and receiving wireless signals as efficiently as desired. If a wireless device is not working properly, the device can be calibrated, reworked, or discarded.

Wireless devices that may be tested in this way include desktop computers, computer monitors, computer monitors containing embedded computers, wireless computer cards, wireless adapters, televisions, set-top boxes, gaming consoles, routers, portable electronic devices such as laptop computers, tablet computers, handheld devices such as cellular telephones and media players, wrist-watch devices, pendant devices, headphone and earpiece devices, and other wearable and miniature devices. Processes involved in manufacturing portable electronic devices such as cellular telephones are sometimes described herein as an example.

Because wireless devices are tested during manufacturing, they may sometimes be referred to as devices under test (DUTs). Once the manufacturing process is complete and testing has proven successful, a device under test may be packaged and sold to an end user.

Figure 1:
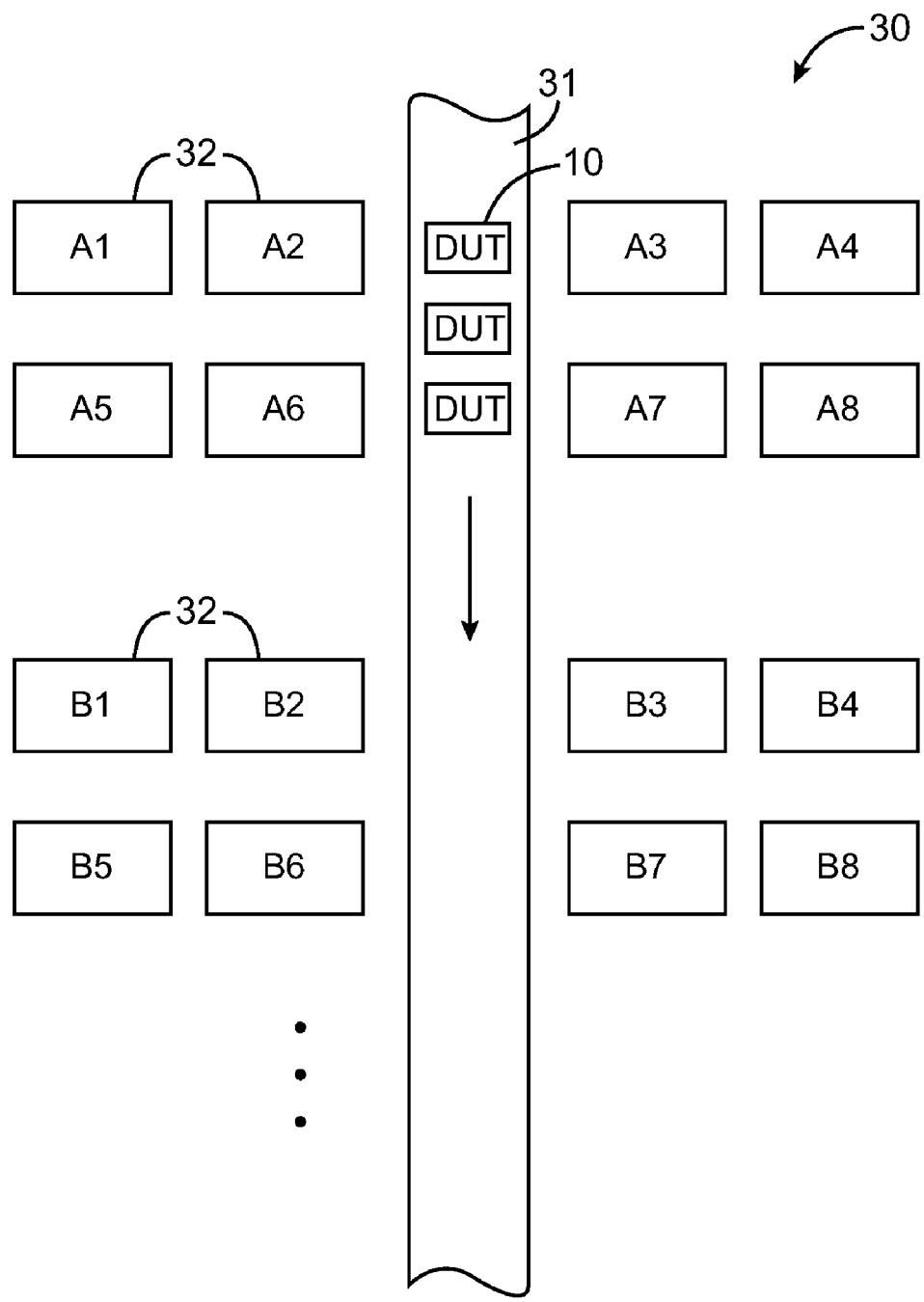
FIG. 1 is a top view of an illustrative manufacturing line showing how devices on a conveyor belt may pass by numerous test stations in accordance with an embodiment of the present invention.

An illustrative manufacturing line that may be used in testing wireless devices is shown in FIG. 1. As shown in FIG. 1, test system 30 may include a conveyance system such as conveyor belt 31 that conveys devices under test 10 past one or more banks of test stations 32. In a typical test system environment, there may be more than one type of test station. In the example of FIG. 1, DUTs 10 pass through a set of test stations of type A (i.e., stations A1 . . . A8) and then pass through a set of test stations of type B (i.e., stations B1 . . . B8). Additional types of test stations may be used in system 30 if desired. The illustrative arrangement of FIG. 1 includes eight test stations of each type, but fewer test stations of a given type may be included in each bank of test stations or each bank of test stations may include more test stations.

Personnel on the manufacturing line (i.e., the operators of test stations 32) or automatic loading equipment may be used to transfer DUTs 10 between conveyor belt 31 and test stations 32. After testing in test stations 32 of type A, DUTs 10 may be returned to conveyor belt 31. These DUTs can then travel to test stations 32 of type B for testing. Further test stations may likewise be visited until all desired tests are complete.

Test measurements made with system 30 may be used for calibration. For example, test measurements may be made that characterize RF path loss for over-the-air and wired paths. These test measurements may be used to program DUTs with compensating offset values or may be used to gather statistical information that is used in calibrating DUTs.

Test measurements in system 30 may also be made as part of a pass-fail testing scheme. With this type of approach, parameter limits (e.g., maximum or minimum path loss limits) may be established. If testing reveals that a DUT's performance does not fall within desired limits, the DUT may be reworked or discarded. If testing reveals that a DUT is performing within expected limits, the DUT may be shipped and sold to a wholesale or retail customer.

To address the numerous issues of conventional test system calibration techniques, systems of the type shown in FIG. 1 can be self-tested as part of the manufacturing process by running at least some of DUTs 10 back through test stations 32 additional times. In this way, regular production DUTs can serve as temporary reference DUTs that gauge the performance of test stations 32 without requiring manpower-intensive or error-prone calibration activities and without requiring use of conventional reference DUTs or reference antennas.

Figure 2:
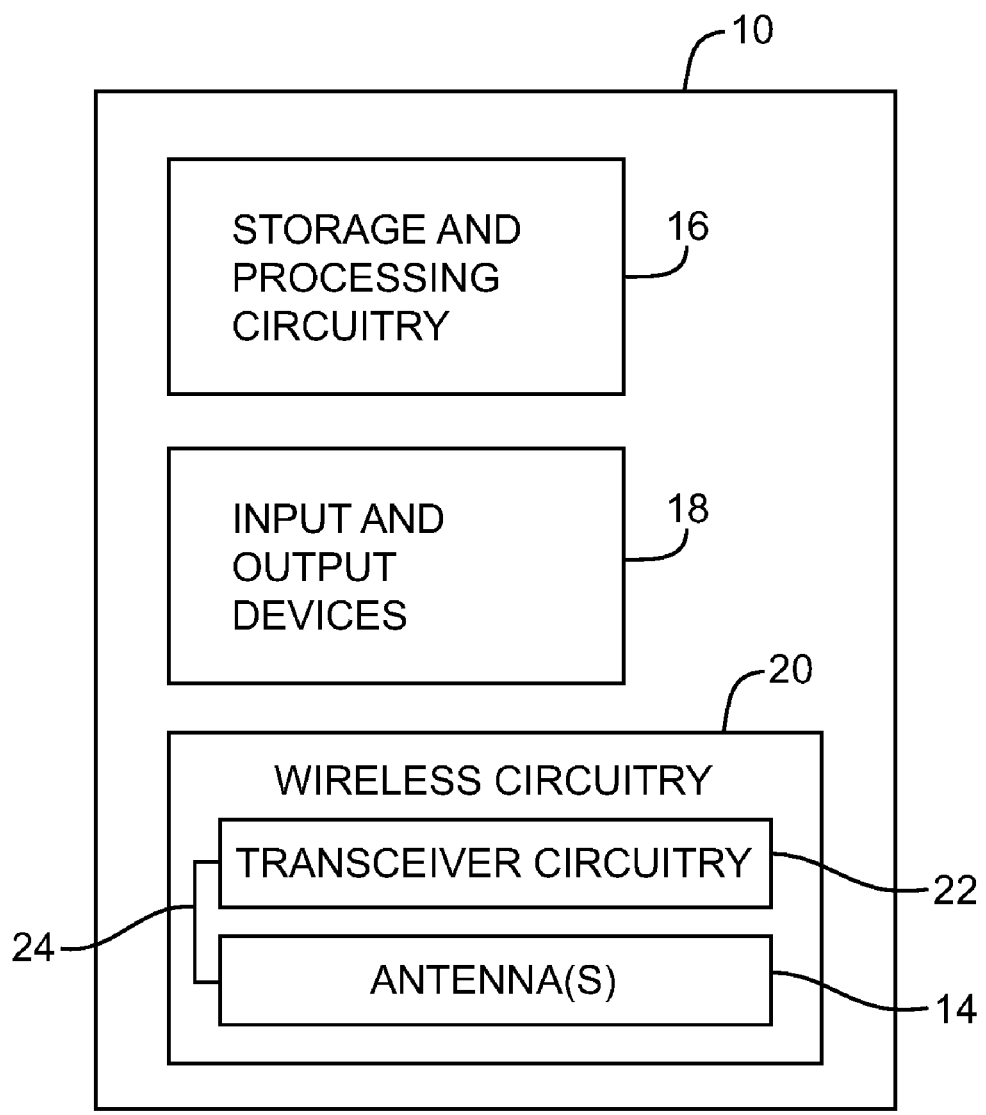
FIG. 2 is a circuit diagram of an illustrative electronic device that may be tested using test stations of the type shown in FIG. 1 and that may be used in determining whether to calibrate test stations of the type shown in FIG. 1 in accordance with an embodiment of the present invention.

An illustrative wireless electronic device of the type that may be tested using test system 30 of FIG. 1 (i.e., a device which may serve as one of DUTs 10 of FIG. 1) is shown in FIG. 2.

As shown in FIG. 2, device 10 may include storage and processing circuitry 16. Storage and processing circuitry 16 may include one or more different types of storage such as hard disk drive storage, nonvolatile memory (e.g., flash memory or other electrically-programmable-read-only memory), volatile memory (e.g., static or dynamic random-access-memory), etc. Storage and processing circuitry 16 may be used in controlling the operation of device 10. Processing circuitry in circuitry 16 may be based on processors such as microprocessors, microcontrollers, digital signal processors, dedicated processing circuits, power management circuits, audio and video chips, and other suitable integrated circuits.

With one suitable arrangement, storage and processing circuitry 16 may be used to run software on device 10, such as internet browsing applications, voice-over-internet-protocol (VOIP) telephone call applications, email applications, media playback applications, operating system functions, antenna and wireless circuit control functions, etc. Storage and processing circuitry 16 may be used in implementing suitable communications protocols. Communications protocols that may be implemented using storage and processing circuitry 16 include internet protocols, wireless local area network protocols (e.g., IEEE 802.11 protocols—sometimes referred to as Wi-Fi®), protocols for other short-range wireless communications links such as the Bluetooth® protocol, protocols for handling cellular telephone communications services, etc.

Input-output devices 18 may be used to allow data to be supplied to device 10 and to allow data to be provided from device 10 to external devices. Examples of input-output devices 18 that may be used in device 10 include display screens such as touch screens (e.g., liquid crystal displays or organic light-emitting diode displays), buttons, joysticks, click wheels, scrolling wheels, touch pads, key pads, keyboards, microphones, speakers and other devices for creating sound, cameras, sensors, etc. A user can control the operation of device 10 by supplying commands through devices 18 or by supplying commands to device 10 through an accessory that communicates with device 10 through a wireless or wired communications link. Devices 18 or accessories that are in communication with device 10 through a wired or wireless connection may be used to convey visual or sonic information to the user of device 10. Device 10 may include connectors for forming data ports (e.g., for attaching external equipment such as computers, accessories, etc.).

Wireless communications devices 20 may include communications circuitry such as radio-frequency (RF) transceiver circuitry 22. Circuitry 22 may include one or more integrated circuits such as baseband processors, radio-frequency transceivers, power amplifiers, matching circuits, filters, and switching circuitry. One or more transmission lines such as transmission lines 24 may be used to route radio-frequency antenna signals between antennas 14 and transceiver circuitry 22. Transmission lines 24 may include microstrip transmission lines, coaxial cable transmission lines, etc.

During testing in system 30 of FIG. 1, radio-frequency signals may be transmitted and received by wireless circuitry 22. Over-the-air tests (e.g., tests to make RF path loss measurements) may be performed using transceiver circuitry 22 and antennas 14. When performing over-the-air tests, the DUT may be placed in a RF test chamber that includes an antenna that is coupled to an RF tester (sometimes referred to as a test unit). Test signals may be transmitted to the test chamber antenna by an RF transmitter in transceiver 22. Test signals that have been transmitted from the test chamber antenna may be received by a receiver in transceiver 22. Wired tests (e.g., tests to make RF path loss measurements) may be performed using a probe or a dedicated fixture (e.g., a fixture in a test chamber) that forms part of a wired connection between transceiver circuitry 22 and the test equipment.

Figure 3:
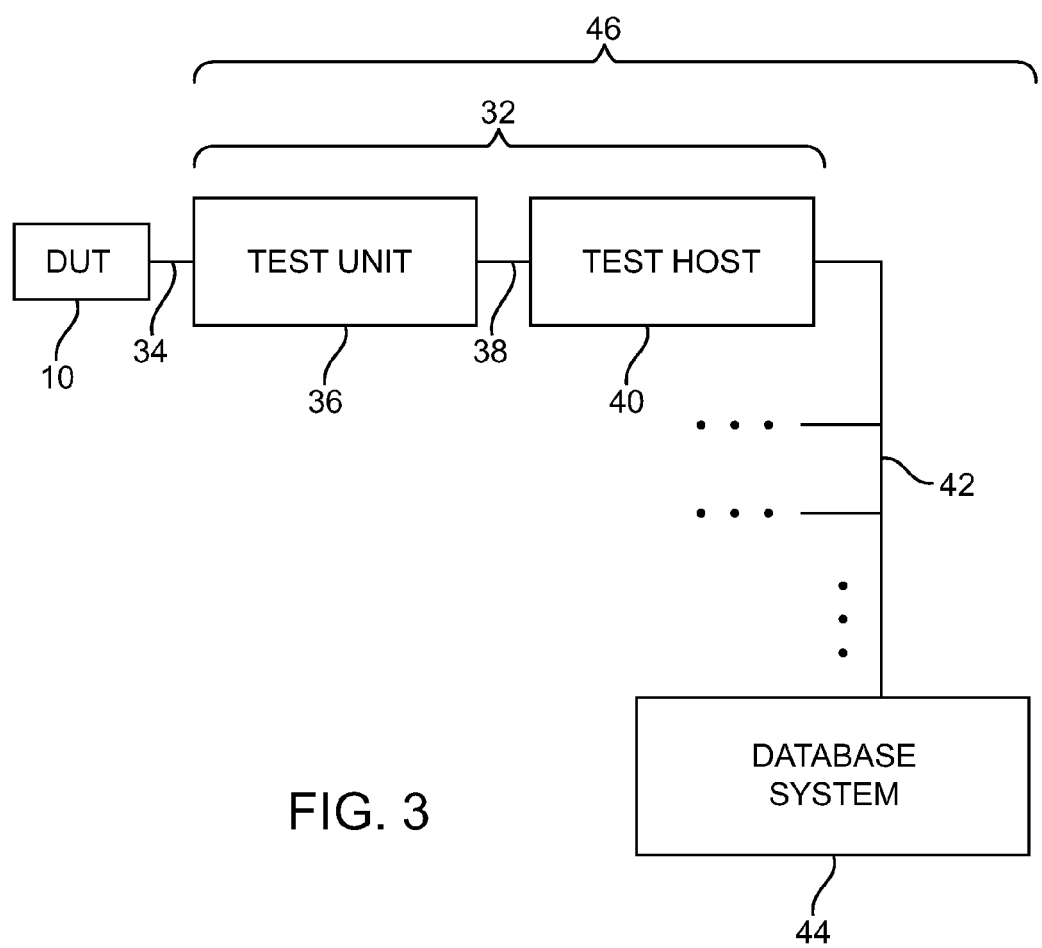
FIG. 3 is a diagram of an illustrative device under test and an associated test station in a test system in accordance with an embodiment of the present invention.

FIG. 3 shows how test equipment 46 may be coupled to DUT 10 by path 34 during testing. Test equipment 46 may include test stations 32 that are connected by network 42 to database system 44 or other computing equipment. Network 42 may include wired and wireless local area network paths, wide area network paths (e.g., the internet) or other suitable communications paths. Database system 44 may be implemented on one or more computers or other computing equipment that can store data gathered from multiple test stations 32 and that can analyze stored data.

Each test station 32 may include a test host such as test host 40 and a test unit such as test unit 36. Test host 40 may be a computer that is used to control the operation of test unit 36 and that is used to gather data from test unit 36 over path 38. Path 38 may be a wired or wireless path. Test unit 36, which may sometimes be referred to as a test box or tester, may be a radio-frequency tester that can generate radio-frequency test signals at known powers in desired bands and channels and that can receive radio-frequency test signals in these bands and channels and can measure their powers. Test unit 36 may be used in making path loss measurements (e.g., radio-frequency path loss measurements) that characterize the attenuation over path 34. Path 34 may be a wired path (i.e., a path that includes a cable and a fixture that taps into a transmission line in DUT 10) or may be a wireless path between an antenna associated with test station 32 (i.e., an antenna located in a test chamber) and an antenna in a DUT.

To determine which stations in test system 30 require calibration, a technician can pass at least some DUTs through each of the test stations 32 in the system. Even though the DUTs that are passed through the test stations are not calibrated "reference" DUTs, the process of passing the DUTs through each of the test stations allows statistical measurement data to be gathered. This statistical data can be automatically provided to database system 44 over network communications paths 42 for storage and analysis. Statistical analysis using system 44 can reveal how each test station compares to others (test station accuracy). If multiple tests are performed at the same station with a given DUT, statistical analysis can also reveal how stations compare to themselves (test station precision).

An illustrative table of test station data that can be gathered by passing one of DUTs 10 through multiple test stations 32 is shown in FIG. 4. In the table of FIG. 4, two DUTs 10 have been selected from the line by a technician (or automated positioning equipment) and run through multiple test stations. In particular, a first DUT (a DUT with serial number 111) has been passed through test station A1 twice (during tests 1 and 2) and has been passed through test station A2 twice (during tests 4 and 5). A second DUT (serial number 112) has been passed through test station number A4 (once during test 7). The table of FIG. 4 contains transmitted radio-frequency power measurements (TX POW). This is merely illustrative. Any suitable operational parameters may be measured using test stations 32. The measurement of transmitted power values is shown as an example. Moreover, there may, in general, be numerous measurements of the type shown in FIG. 4 (e.g., tens, hundreds, thousands, etc.).

The entries in the table of FIG. 4 may be processed to produce mean values for each test station (station means) and mean values of all stations of a given station type (population means). The entries may also be analyzed to produce associated distribution values.

The means of the entries for tests 1 and 2 is $\mu S_{A1}$, where $\mu S$ indicates that the means is a station mean and where the subscript A1 refers to the fact that this data is associated with test station A1. The distribution value (i.e., the maximum to minimum difference value R in this example) may be any suitable metric that is representative of the spread of the data samples (i.e., a standard deviation value $\sigma$, a max-min value R, etc.). When sample sizes are small (e.g., two or three data points per station), difference values (i.e., max–min R) may be more immune to producing spurious results than standard deviation values.

As shown in the table of FIG. 4, the first time that the first DUT was tested in test station A1, the transmitted power that was measured was 23.4 dB. The second time that the first DUT was tested in test station A1, the transmitted power that was measured was 23.2. The average of these two measured powers ($\mu S_{A1}$) is 23.3 dB and the max-min value is 0.2 dB. The additional data in the table of FIG. 4 corresponds to additional measurements made using the first DUT in station A2 (i.e., a second station of type A) and measurements made using the second DUT in stations A3 and A4. In a complete table of the type shown in FIG. 4, there are typically numerous measurements corresponding to the numerous test stations in the test system allowing population means ($\mu P$) to be computed. In general, any number of DUTs may be selected off of conveyor belt 31 and rerun through the test stations (e.g., one, two, three, four, more than four, etc.). As an example, several DUTs or even tens of DUTs may be rerun through the test stations each day.

Because each selected DUT is being tested in the multiple stations and, if desired, repeatedly in each of these test stations, information on inter-station performance variations (test station accuracy) and intra-station performance variations (test station repeatability) can be gathered. This information on test station performance may be used to generate alerts, may be used to trigger automatic or manual recalibration procedures, may be used to flag or otherwise identify stations as requiring service, may be used to determine which stations should be taken offline, may be used to generate reports that are displayed on a computer monitor in equipment 44 of FIG. 3 or that are printed out using a printer in equipment 44, or may be used to take other suitable actions.

If desired, a station can be flagged as needing recalibration whenever calibration measurements fall outside of a first set of predetermined limits relative to the mean for a station type population. A station may be labeled as unhealthy (and in need of immediate deactivation) if calibration measurements fall outside of a second set of predetermined limits with respect to the population mean. If desired, these limits may be periodically revised to ensure that a desired number of stations are flagged for re-calibration (e.g., to ensure that at least a first fraction, but not more than a second fraction, of stations are flagged for re-calibration each day). The periodic updating of the limits may be performed dynamically based on data taken during the audits of stations.

Figure 5:
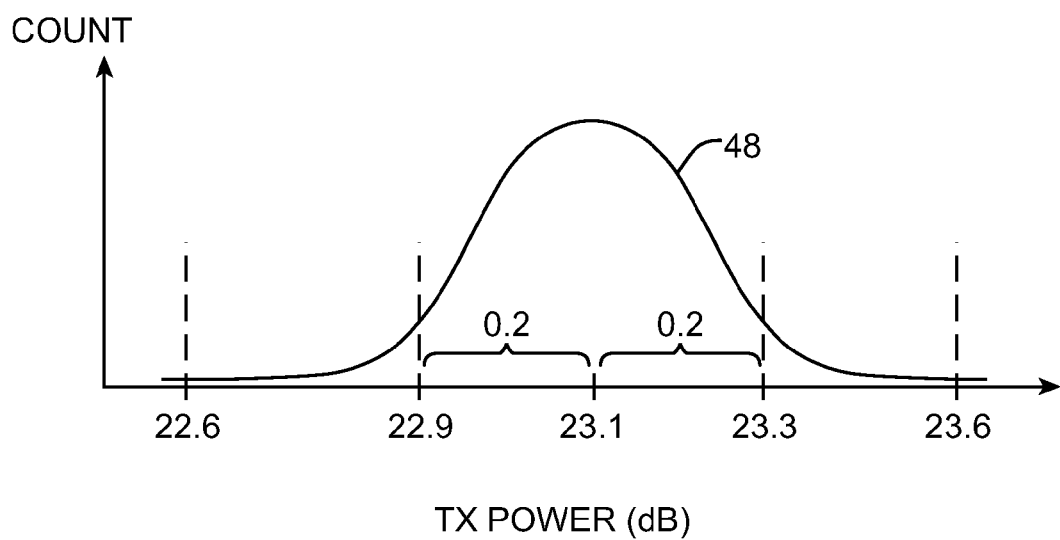
FIG. 5 is a graph showing how test measurements may be compared to different types of limits during test data analysis operations in accordance with an embodiment of the present invention.

Consider, as an example, the use of DUTs to measure a radio-frequency parameter such as transmitted radio-frequency power (TX POWER). The DUTs may be regular production DUTs that have been rerun through the test stations after having initially passed testing. Trace 48 in the graph of FIG. 5 is a distribution of TX POWER measurements made with a set of test stations of a given type (e.g., type A). The average TX power measured by stations of this type (i.e., the mean for the entire population of stations that were tested) is 23.1 dB (in this example). There are more "counts" near 23.1 dB than at higher or lower TX power measurement values, as expected for a properly functioning set of test stations.

As shown in FIG. 5, a first set of limits (i.e., a lower limit of 22.9 dB and an upper limit of 23.3 dB corresponding to a +/− variation of 0.2 dB with respect to the population mean μP) may be used to determine whether or not a test station requires recalibration. A second set of limits that is wider than the first (i.e., a lower limit of 22.6 dB and an upper limit of 23.6 dB corresponding to a +/− variation of 0.5 dB with respect to the population mean μP) may be used to determine whether or not a test station is unhealthy and should be immediately taken offline. If a selected DUT that is being rerun through a test station produces a TX POWER measurement that falls inside the first set of limits, the test station may be considered to be functioning properly. If the TX POWER measurement has a value that lies between the first and second sets of limits, the test station may be flagged for recalibration. If the TX POWER measurement has a value that lies outside of the second set of limits, the test station may be labeled as unhealthy and can be shut down or otherwise taken offline until it is recalibrated.

Figure 6:
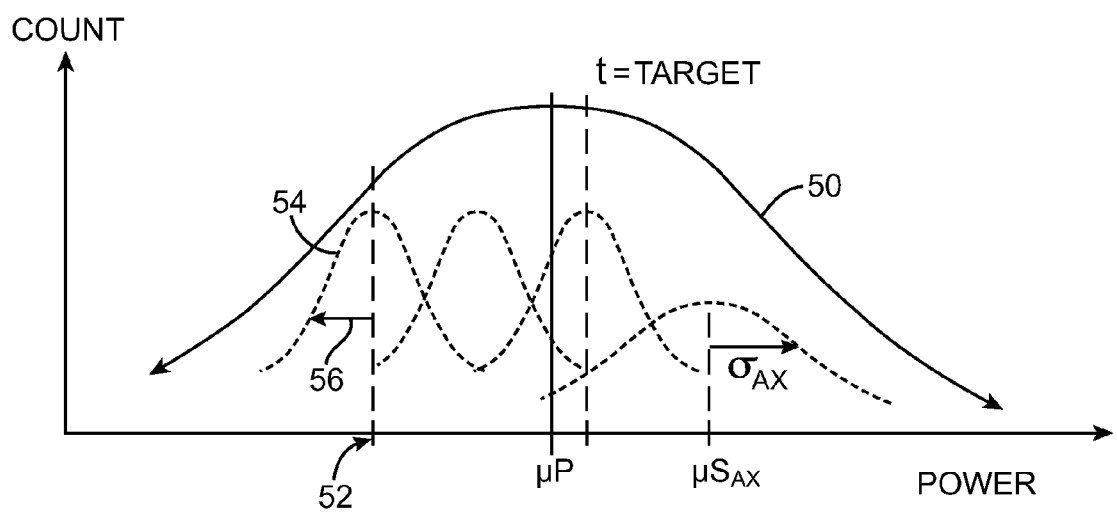
FIG. 6 is a graph showing how test system accuracy and precision is affected by the accuracy and precision of individual test stations in accordance with an embodiment of the present invention.

Stations that have poor precision (i.e., stations whose measurements are not sufficiently repeatable) may be detected by rerunning tests with a single DUT at the same test station. The impact of a station with poor repeatability on a population of multiple test stations in system 30 is shown in the graph of FIG. 6. As shown in FIG. 6, each test station has its own distribution (in this example, count is plotted as a function of power—e.g., TX POWER). For example, a station may be characterized by distribution 54 having station mean 52 and station distribution width 56 (e.g., σ or R). Other test stations may have performance characteristics of their own. Each of these individual test station distributions contributes to an overall distribution for a population of test stations of the same type (e.g., all test stations of test station type A). The cumulative distribution for all of the test stations corresponds to trace 50. The amount by which the mean μP of trace 50 (i.e., the average of the entire population of measured test stations) varies from desired target value t is an indicator of how accurate these test stations are at making measurements. In practice, when the number of test data samples is large, population mean μP and target t can be taken to be equal to one another. The breadth of trace 50 is an indicator of how repeatable the population of test stations will be when making measurements. If a particular test station is not able to produce sufficiently repeatable results, the overall breadth of trace 50 and therefore the ability of the population of test stations to properly perform tests may be jeopardized. In the example of FIG. 6, test station AX is producing results with unacceptably poor repeatability ($\sigma_{AX}$ is too large).

Poor repeatability at a particular test station can be detected by rerunning a given DUT (i.e., a DUT that has passed testing) through a give station multiple times (e.g., two or three times or more). This optional step may be performed on each of the test stations (i.e., all test stations of type A). When multiple measurements are gathered at the same station, distribution characteristics such as standard deviation σ and max-min value R can be produced to determine whether stations are sufficiently precise.

Figure 7:
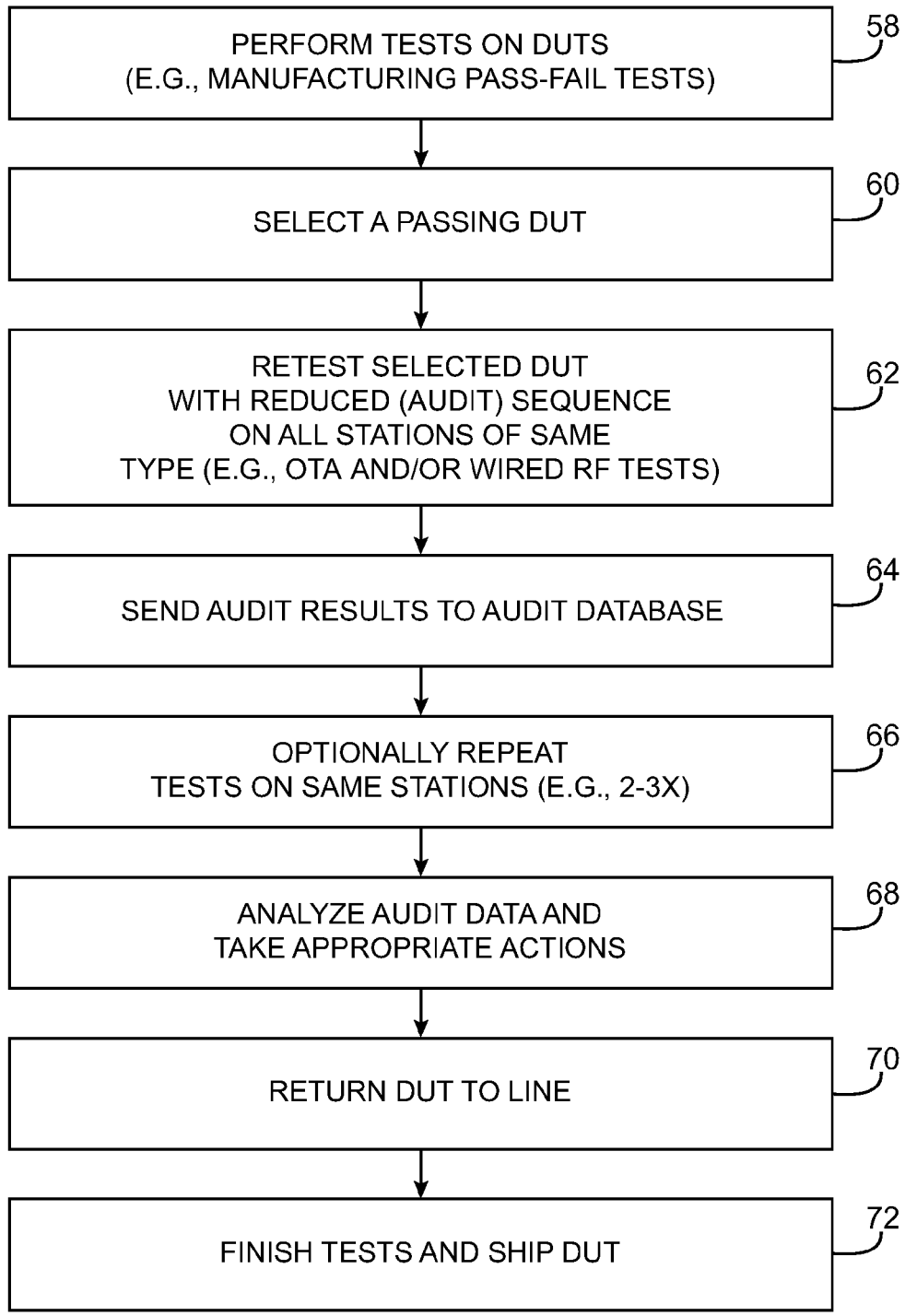
FIG. 7 is a flow chart of illustrative steps involved in performing test system measurement operations in accordance with an embodiment of the present invention.

Illustrative steps involved in monitoring the accuracy and precision of system 30 of FIG. 1 by rerunning selected production DUTs back through the test stations are shown in FIG. 7.

At step 58, system 30 (FIG. 1) may be used in testing DUTs 10. The tests that are performed may be radio-frequency tests. For example, the tests may be power measurement tests that are used in calculating radio-frequency path losses. Examples of radio-frequency test measurements of this type are measurements of TX uplink power—i.e., the power received by a test unit in an audit station when the DUT transmits at maximum power as measured across all channels and bands—and RX downlink power—i.e., RSSI values, which corresponding to the power received at the DUT when a known power is transmitted by the test unit). Testing may be performed at the end of a manufacturing line or at any other suitable point during the manufacturing process to determine whether DUTs 10 are operating properly and can be shipped and sold to wholesale and retail customers. Test stations 32 may be configured to produce a pass-fail indicator following each DUT test. The pass-fail indicator may be presented to an operator (technician) using audio, video, a printout, a status indicator such as a light, graphics and text or other information that is displayed on a test station computer monitor (e.g., on a test host), or using an output of other suitable formats. If the indicator informs an operator (or automated equipment) that a DUT has failed to meet predetermined performance criteria, the DUT may be reworked or discarded.

Some of the DUTs 10 that pass testing can be rerun through the test stations. As shown in FIG. 7, an operator (or automated equipment) may, for example, select a DUT to rerun through the test stations during step 60. An operator may select a given DUT by removing that DUT from conveyor belt 31 after the DUT has successfully passed by a bank of test stations (i.e., after the DUT has cleared the test stations A of FIG. 1, but before the DUT has begun testing in stations B).

At step 62, the selected DUT may be retested using test stations 32. An operator may, for example, insert the selected DUT in a fixture in a test chamber in each of multiple test stations 32. Once mounted properly within a test station, the operator may use a test host in the test station or other mechanism to initiate a test sequence on the selected DUT. To ensure that the retesting process proceeds with minimal delay, the tests that are performed during the retesting operations of step 62 may correspond to a subset of the full tests that are performed during the testing operations of step 58 (i.e., testing during step 62 may be performed using a reduced sequence of test measurements—sometimes referred to as an audit sequence). The selected DUT may be retested at one or more of test stations 32 (i.e., some or all of the test stations of a particular type such as type A or type B in the FIG. 1 example). This process may be repeated with multiple selected DUTs. Because the selected DUTs are known to have acceptable performance (because the selected DUTs passed the tests performed at step 58), the tests that are performed at the various test stations using the selected DUTs serve as an audit of test station performance. The data (audit results) gathered from each of the retested test stations during step 62 may be provided to an audio database (database system 44) over network 42 (step 64).

At step 66, tests may be performed with the selected DUTs in which some or all of the test stations are repeatedly tested. For example, a selected DUT that has been tested at test station A2 a first time may be removed from test station A2 (e.g., by disconnecting the selected DUT from test fixture in test station A2) and reinserted in test station A2 before being tested a second time. Multiple tests (e.g., two, three, or more) may be performed at each test station. By gathering same-station data from a given test station in this way, the precision (repeatability) of the given test station may be determined. If desired, some or all of the test stations in a given bank of test stations (i.e., all test stations of type A) may be subjected to repeat tests of this type.

After performing the repeat tests of step 66 and providing corresponding audit results (gathered test data) to database system 44 over network 42, the data that was provided to database system 44 may be analyzed (step 68). Analysis results may include data on the accuracy of the stations, data on the repeatability (precision) of the stations, etc. Suitable actions may be taken based on the results of the data analysis performed at step 68. Actions that may be taken include recalibrating stations whose performance is not acceptable, shutting down stations with poor performance (at least until they may be recalibrated), generating reports, issuing alerts, etc.

At step 70, selected DUTs may be returned to the manufacturing line (e.g., by placing each selected DUT back on conveyor belt 31.

At step 72, following successful completion of any additional desired tests, the DUT may be shipped to an end user.

Figure 8:
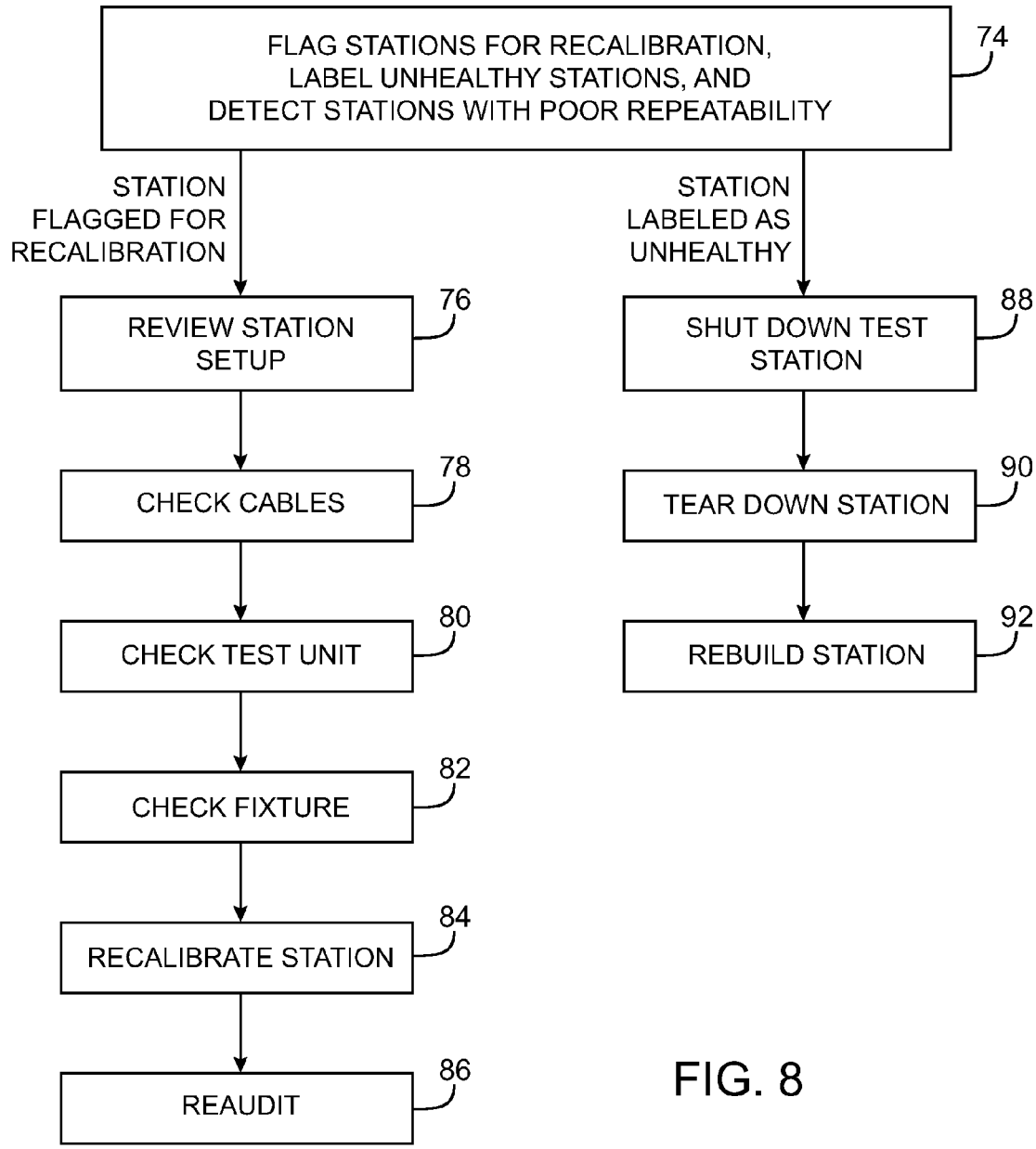
FIG. 8 is a flow chart of illustrative actions that may be taken in response to detecting that test stations are not behaving as accurately and precisely as desired in accordance with an embodiment of the present invention.

Illustrative actions that may be taken in response to the results of the data analysis performed during step 68 are shown in FIG. 8.

At step 74, test stations that are associated with measurements that are outside of healthy limits may be labeled as unhealthy and test stations that are within healthy limits—but that outside of minimum acceptable performance limits (flag limits)—may be flagged for recalibration. Stations that exhibit poor repeatability may be identified.

Consider, as an example, the test station measurements of FIG. 4 and the limits described in connection with FIG. 5. In this example, TX power was measured. Data acquired with a selected DUT (DUT serial number 111 in the FIG. 4 example) was used to retest stations A1 and A2. During the analysis operations of step 68, the mean of the four samples taken during tests 1, 2, 3, and 4 (i.e., the population mean of 23.1 dB) was calculated and the mean of each station's samples (e.g., the $\mu S_{A1}$ station mean of 23.3 dB and the $\mu S_{A2}$ station mean of 22.8 dB) was calculated. The distribution width (e.g., the σ value or, in this example, the max–min value R) was also calculated for each station.

This data can then be compared to predefined limits. In the FIG. 4 example, the "flag limits" for TX power were +/−0.2 dB relative to the mean power of the measured population (23.1 dB). The "healthy limits" for TX power were +/−0.5 dB with respect to the mean power.

In this example, the value of $\mu S_{A1}$ is therefore within the "flag limits," because $\mu S_{A1}$ is no more than 0.2 dB away from the population mean of 23.1 dB. The value of the station mean (for station A1) relative to the population mean (for all stations) therefore indicates that test station A1 is healthy and is not in need of being flagged for recalibration (i.e., A1 is within the flag limits). The value of $\mu S_{A2}$ is lower than lower flag limit 22.9, but is higher than the lower "healthy" limit of 22.6, indicating that test station A2 is healthy, but should be flagged for recalibration.

Stations that have poor intra-station precision (poor repeatability) may be detected by computing σ, R, or other suitable data spread (distribution) metric for each station and comparing to intra-station variability limits. An example of intra-station limits that may be used in the context of transmitted radio-frequency power measurements is an intra-station flag limit +/−0.3 dB and an intra-station healthy limit of +/−0.4 dB (as an example). The values of R of FIG. 4 indicate that station A1 is healthy and need not be flagged for precision recalibration (because R for A1 is less than or equal to 0.3 dB) and indicate that station A2 is healthy, but should be flagged for recalibration (because R for A2 in the FIG. 4 example is greater than 0.3 dB and less than or equal to 0.4 dB.)

After flagging stations that require recalibration and labeling unhealthy stations (i.e., due to violations of desired limits on accuracy and repeatability), processing may proceed to step 76 or step 88, accordingly.

If, for example, a station was flagged as requiring recalibration, processing may proceed to step 76. During the operations of step 76, a technician may review how the flagged station is set up. This may involve visual inspection, checking software settings, etc.

At step 78, the technician may check the cables in the test system to ensure that they are properly attached between the test unit and the DUT.

At step 80, the technician may check for proper operation of the radio-frequency test unit in the test system (e.g., to determine whether the test unit is configured with proper settings, etc.).

At step 82, the technician may check the fixture to which the DUT is mounted (e.g., to determine whether the DUT is properly seated within the fixture).

At step 84, the technician may recalibrate the test station (e.g., by using a vector network analyzer to make calibrating path loss measurements).

At step 86, the selected DUT may again be tested with the recalibrated version of the test station to ensure that the test station has now been properly calibrated (i.e., to ensure that the test station is within the flag limits and healthy station limits). If the station is operating properly, the station can be returned to service. If necessary, the checking and recalibration operations of FIG. 8 may be repeated.

If, at step 74, the test station was flagged as being unhealthy, the station may be powered down or otherwise taken offline at step 88. This prevents additional DUTs 10 from being tested and passed through an unreliable test station.

At step 90, a technician may disassemble components of the station (e.g., by removing cables, fixtures, etc.).

At step 92, the technician may rebuild and calibrate the test station and may return the completed station to use in test system 30.

Although sometimes described herein in the context of radio-frequency calibration operations, the calibration techniques described herein can be applied to any other system with similar properties. For example, these calibration techniques may be used in testing and performing test station audits in the context of acoustic test systems, compass test systems, gyroscope test systems, etc. The use of radio-frequency test calibration techniques is merely described herein as an example.

The foregoing is merely illustrative of the principles of this invention and various modifications can be made by those skilled in the art without departing from the scope and spirit of the invention.

What is claimed is:

1. A method, comprising:
   during testing of devices under test in a test system with a plurality of test stations, selecting a given device under test that has passed a pass-fail test in a given one of the plurality of test stations;
   testing the selected device under test with the plurality of test stations to gather test data on the plurality of test stations; and
   with computing equipment, determining whether to calibrate any of the plurality of the test stations by analyzing the gathered test data.

2. The method defined in claim 1 wherein testing the selected device under test with the test stations comprises making radio-frequency test measurements with the device under test in each of the plurality of the test stations.

3. The method defined in claim 2 wherein making the radio-frequency test measurements comprises making wireless radio-frequency test measurements.

4. The method defined in claim 3 wherein making the wireless radio-frequency test measurements comprises making path loss measurements.

5. The method defined in claim 2 wherein making the radio-frequency test measurements comprises making wired radio-frequency test measurements.

6. The method defined in claim 5 wherein making the wired radio-frequency test measurements comprises making path loss measurements.

7. The method defined in claim 1 further comprising:
   testing the selected device under test multiple times in a given one of the plurality of test stations to gather test data on the given one of the plurality of test stations.

8. The method defined in claim 7 further comprising:
   determining whether to calibrate the given one of the plurality of test stations by analyzing the gathered test data for the given one of the plurality of test stations.

9. The method defined in claim 8 wherein determining whether to calibrate the given one of the plurality of test stations involves computing a maximum to minimum difference value from the gathered test data for the given one of the plurality of test stations.

10. The method defined in claim 8 wherein determining whether to calibrate the given one of the plurality of test stations involves computing a standard deviation value from the gathered test data for the given one of the plurality of test stations.

11. The method defined in claim 1 further comprising:
    determining whether to take any of the test stations offline by analyzing the gathered test data.

12. The method defined in claim 11 wherein determining whether to take any of the test stations offline comprises applying healthy limits to the gathered test data.

13. The method defined in claim 12 wherein determining whether to calibrate the test stations comprises applying flag limits to the gathered test data.

14. The method defined in claim 1 wherein determining whether to calibrate the test stations comprises computing a mean test data value for the plurality of test stations.

15. The method defined in claim 1 wherein the selected device under test is a production device, the method further comprising:
    following testing of the selected device under test with the plurality of test stations to gather test data on the plurality of test stations, shipping the production device to a consumer.

16. A test system comprising:
    a plurality of radio-frequency test stations that are configured to perform pass-fail testing on wireless devices under test during manufacturing, wherein the plurality of radio-frequency test stations are configured to gather test data during radio-frequency wireless testing of the devices under test and each gather test data from a selected one of the devices under test that has passed testing in a given one of the plurality of radio-frequency test stations; and
    computing equipment that is configured to determine whether to flag the radio-frequency test stations for calibration by analyzing the test data gathered from the selected one of the devices under test.

17. The test system defined in claim 16 wherein the computing equipment is configured to determine whether to label the radio-frequency test stations as being unhealthy by analyzing the gathered test data.

18. A method, comprising:
    during wireless radio-frequency testing of devices under test in a test system with a plurality of radio-frequency test stations, selecting a given device under test that has passed testing in a given one of the plurality of test stations;
    testing the selected device under test multiple times in a given one of the plurality of test stations to gather test data on the given one of the plurality of test stations; and
    with computing equipment, determining whether the given one of the plurality of test stations takes measurements that are sufficiently repeatable by analyzing the gathered test data for the given one of the plurality of test stations.

19. The method defined in claim 18 wherein the method further comprises:
    determining whether to recalibrate the test stations by computing a mean test measurement value from gathered test data corresponding to a plurality of different stations among the plurality of the test stations and by comparing at least some of the gathered test data to the computed mean test measurement value.

* * * * *